(12) United States Patent
Lee (10) Patent No.: US 8,785,962 B2
(45) Date of Patent: Jul. 22, 2014

(54) SEMICONDUCTOR LIGHT EMITTING DEVICE HAVING CURRENT BLOCKING LAYER

(75) Inventor: Wan Ho Lee, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/481,463

(22) Filed: May 25, 2012

(65) Prior Publication Data

US 2012/0299048 A1 Nov. 29, 2012

(30) Foreign Application Priority Data

May 27, 2011 (KR) .................... 10-2011-0050520

(51) Int. Cl.
*H01L 33/00* (2010.01)
(52) U.S. Cl.
USPC ............................................................. 257/99
(58) Field of Classification Search
CPC ....................................................... H01L 33/14
USPC ............................................................. 257/99
See application file for complete search history.

(56) References Cited

U.S. PATENT DOCUMENTS

| | | | | |
|---|---|---|---|---|
| 6,307,218 B1* | 10/2001 | Steigerwald et al. | ........... | 257/99 |
| 6,345,064 B1* | 2/2002 | Fujii | ........... | 372/46.01 |
| 2001/0050530 A1* | 12/2001 | Murakami et al. | ........... | 313/498 |
| 2008/0246047 A1* | 10/2008 | Hsu et al. | ........... | 257/98 |
| 2008/0315236 A1 | 12/2008 | Lu et al. | | |
| 2010/0065867 A1* | 3/2010 | Unno | ........... | 257/98 |
| 2010/0127303 A1* | 5/2010 | Hwang et al. | ........... | 257/99 |

FOREIGN PATENT DOCUMENTS

| | | |
|---|---|---|
| EP | 2369646 A1 | 9/2011 |
| KR | 10-2006-0038756 A | 5/2006 |
| KR | 10-2009-0027329 A | 3/2009 |

OTHER PUBLICATIONS

Extended European Search Report issued in European Patent Application No. 12169466.5 mailed Oct. 2, 2012.

* cited by examiner

*Primary Examiner* — Anthony Ho
(74) *Attorney, Agent, or Firm* — McDermott Will & Emery LLP (57) ABSTRACT

There is provided a semiconductor light emitting device including: a semiconductor light emitting laminate including a first conductive semiconductor layer, a second conductive semiconductor layer, and an active layer interposed therebetween; a first electrode having at least one bonding pad formed on a portion of an upper surface of the first conductive semiconductor layer; a second electrode having an ohmic contact layer formed on the second conductive semiconductor layer; and a current blocking layer between the second conductive semiconductor layer and the ohmic contact layer having a plurality of patterns formed thereon, the plurality of patterns being arrayed such that intervals between patterns adjacent to a region overlapped with the bonding pad are smaller an interval between patterns of another regions.

25 Claims, 7 Drawing Sheets

SEMICONDUCTOR LIGHT EMITTING DEVICE HAVING CURRENT BLOCKING LAYER

CROSS-REFERENCE TO RELATED APPLICATIONS

This application claims the priority of Korean Patent Application No. 10-2011-0050520 filed on May 27, 2011, in the Korean Intellectual Property Office, the disclosure of which is incorporated herein by reference.

BACKGROUND OF THE INVENTION

1. Field of the Invention

The present invention relates to a semiconductor light emitting device, and more particularly, to a semiconductor light emitting device having a current blocking layer.

2. Description of the Related Art

A semiconductor light emitting device has strengths as a light source in terms of high output, excellent light efficiency and reliability thereof, and therefore, research thereinto and development thereof to allow for use as a high output and a high efficiency light source in a backlight in a lighting device or a display device has been actively undertaken.

In general, a semiconductor light emitting device includes an active layer able to emit light by the recombination of electrons and holes between and a p-type semiconductor layer and an n-type semiconductor layer. Such semiconductor light emitting devices may be classified according to a position in which an electrode is located to form a semiconductor layer or according to a current path, and although they are not particularly limited, the classification thereof may be determined depending upon whether or not electrical conductivity exists in a substrate mainly used for a semiconductor light emitting device.

For example, when a substrate having electrical insulation is used, mesa etching to form a first electrode connected to a first conductive semiconductor layer may be required. That is, portions of the second conductive semiconductor layer and an active layer may be partially removed to expose a portion in a first conductive semiconductor layer region, and the first electrode is formed on an exposed top surface of the first conductive semiconductor layer.

In the above-mentioned electrode structure, a light emitting area may be reduced during a mesa etching process and may be formed in a direction perpendicular to that of current flow, and thus it may be difficult to promote uniform current distribution across an overall area, which may cause a reduction in light emission efficiency.

Meanwhile, when a conductive substrate is used, the conductive substrate may be used as a side electrode. In this semiconductor light emitting device structure, there is little light loss in a light emitting area as compared to the former structure, and a uniform current flow may be comparatively secured therein, whereby light emission efficiency can be enhanced.

However, in this case, an electrode, mainly an n-side electrode, positioned on the light emission surface should also be formed to have a reduced size in order to smoothly emit light, but in this case, a driving voltage increases, and furthermore, current spreading effects may be deteriorated, whereby a substantial region of an actual active layer may not actually be utilized as an effective light emitting region.

Therefore, in order to increase light emission efficiency in a light emitting diode (LED), research into significantly increasing current spreading effects has become a significant issue and has been urgently required in light emitting devices in order to obtain a high light output, particularly implemented through a large area thereof.

SUMMARY OF INVENTION

An aspect of the present invention provides a semiconductor light emitting device having a structure in which current spreading effects is improved so as to enhance light emission efficiency.

According to an aspect of the present invention, there is provided a semiconductor light emitting device including: a semiconductor light emitting laminate including a first conductive semiconductor layer, a second conductive semiconductor layer, and an active layer interposed therebetween; a first electrode having at least one bonding pad formed on a portion of an upper surface of the first conductive semiconductor layer; a second electrode having an ohmic contact layer formed on the second conductive semiconductor layer; and a current blocking layer between the second conductive semiconductor layer and the ohmic contact layer having a plurality of patterns formed thereon, the plurality of patterns being arrayed such that intervals between patterns adjacent to a region overlapped with the bonding pad are smaller than an interval between patterns of another region.

The first electrode may be formed on the first conductive semiconductor layer and may further include a plurality of electrode branches extended from the bonding pad.

In this case, the plurality of electrode branches may be arrayed in parallel in a direction in which the plurality of patterns are arrayed.

Intervals between the plurality of patterns may be larger in a direction away from the region overlapped with the bonding pad. The plurality of electrode branches may be arrayed to have a predetermined interval therebetween, as needed. Unlike this, the plurality of electrode branches may be respectively formed on regions overlapped with the plurality of patterns.

The at least one bonding pad may be a plurality of bonding pads formed on different regions of the upper surface of the first conductive semiconductor layer.

The plurality of bonding pads may be respectively disposed on opposing corners, and the intervals between the plurality of patterns may become larger toward a region overlapped with the center of the first conductive semiconductor layer.

Among the plurality of patterns, a width of a pattern adjacent to the region overlapped with the bonding pad may be larger than that of another pattern. In this case, widths of the plurality of patterns may be smaller away from the region overlapped with the bonding pad.

The current blocking layer may be formed of an electrically insulating material. Unlike this, the current blocking layer may be formed of a region in which damaged crystals of the second conductive semiconductor layer are formed so as to have a schottky junction with the ohmic contact layer.

The semiconductor light emitting device may further include a conductive substrate provided with the second electrode in order to support the semiconductor light emitting laminate. In this case, the second electrode may further include a barrier layer disposed between the ohmic contact layer and the conductive substrate.

The first electrode may further include a transparent electrode layer formed on the first conductive semiconductor layer, and the bonding pad may be formed on the transparent electrode layer. In this case, the semiconductor light emitting device may further include an additive current blocking layer between the first conductive semiconductor layer and the transparent electrode layer, having a plurality of additional patterns formed thereon. The plurality of additional patterns may be formed on a position not overlapped with the plurality of patterns.

According to another aspect of the present invention, there is provided a semiconductor light emitting device comprising: a semiconductor light emitting laminate including a first conductive semiconductor layer, a second conductive semiconductor layer, and an active layer interposed therebetween; a first electrode having a transparent electrode layer formed on an upper surface of the first conductive semiconductor layer, and at least one bonding pad formed on a portion of the transparent electrode layer; a second electrode having an ohmic contact layer formed on the second conductive semiconductor layer; and a current blocking layer formed between the first conductive semiconductor layer and the transparent electrode layer having a plurality of patterns formed thereon, the plurality of patterns being arrayed such that intervals between patterns adjacent to a region overlapped with the bonding pad are smaller than an interval between patterns of another region.

Intervals between the plurality of patterns may be larger in a direction away from the region overlapped with the bonding pad.

The at least one bonding pad may be a plurality of bonding pads formed on different regions of the upper surface of the transparent electrode layer. In this case, the plurality of bonding pads may be respectively disposed on opposing corners, and the intervals between the plurality of patterns may become larger toward the center of the first conductive semiconductor layer.

Among the plurality of patterns, a width of a pattern adjacent to the region overlapped with the bonding pad may be larger than that of another pattern. In this case, widths of the plurality of patterns may be smaller away from the region overlapped with the bonding pad.

The semiconductor light emitting device may further includes a conductive substrate provided with the second electrode in order to support the semiconductor light emitting laminate. In this case, the second electrode may further include a barrier layer disposed between the ohmic contact layer and the conductive substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Embodiments of the present invention will now be described in detail with reference to the accompanying drawings, such that those having ordinary skill in the art to which the invention pertains could easily implement the embodiments described herein. However, it should be noted that the spirit of the present invention is not limited to the embodiments set forth herein and that those skilled in the art and understanding the present invention could easily accomplish retrogressive inventions or other embodiments included in the spirit of the present invention by the addition, modification, and removal of components within the same spirit, but those are to be construed as being included in the spirit of the present invention.

In addition, like or similar reference numerals denote parts performing similar functions and actions throughout the drawings.

Figure 1:
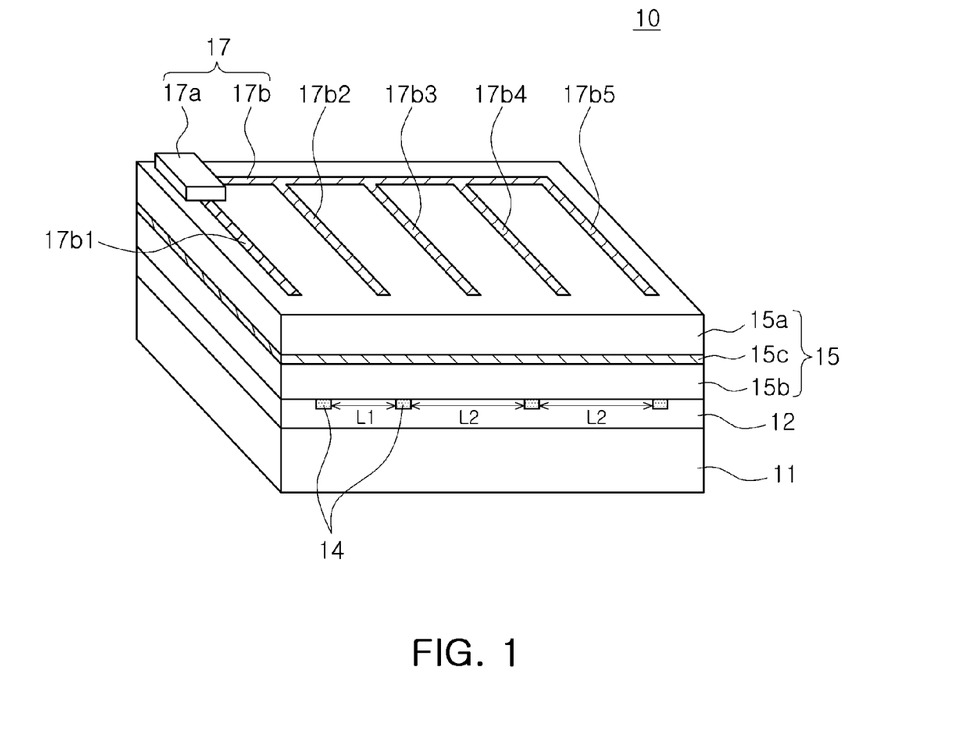
FIG. 1 is a schematic perspective view of a semiconductor light emitting device according to an embodiment of the present invention.

FIG. 1 is a schematic perspective view of a semiconductor light emitting device according to an embodiment of the present invention.

A semiconductor light emitting device 10 according to an embodiment of the present invention may include a semiconductor light emitting laminate 15 including a first conductive semiconductor layer 15a, a second conductive semiconductor layer 15b, and an active layer 15c interposed therebetween. In addition, first and second electrodes 17 and 12 may be respectively formed on the first and second conductive semiconductor layers 15a and 15b.

As shown in FIG. 1, the first electrode 17 may include a bonding pad 17a formed on one corner region of the first conductive semiconductor layer 15a, and the second electrode 12 may include an ohmic contact layer forming ohmic contact with the second conductive semiconductor layer 15b.

The first electrode 17 according to the embodiment of the present invention may further include an extension electrode 17b connected to the bonding pad. The extension electrode 17b may have a structure in which a plurality of electrode branches 17b1 to 17b5 are arrayed in parallel. In the present embodiment, the plurality of electrode branches 17b1 to 17b5 are illustrated as having five electrode branches having a predetermined interval therebetween according to the array direction thereof, but the interval conditions thereof and the number of electrode branches are not limited thereto.

The semiconductor light emitting device 10 according to the embodiment of the present invention may include a current blocking layer 14 formed between the second conductive semiconductor layer 15b and the ohmic contact layer. The current blocking layer 14 may be provided by selectively forming an electrically insulating material such as $SiO_2$ or $SiN_x$, but may also be provided by forming a region of damaged crystals on the second conductive semiconductor layer. This crystal damage may be undertaken by ion implantation, plasma processing, or the like.

The current blocking layer 14 may have a plurality of patterns P1 to P4 formed to be spaced apart from one another.

Figure 2:
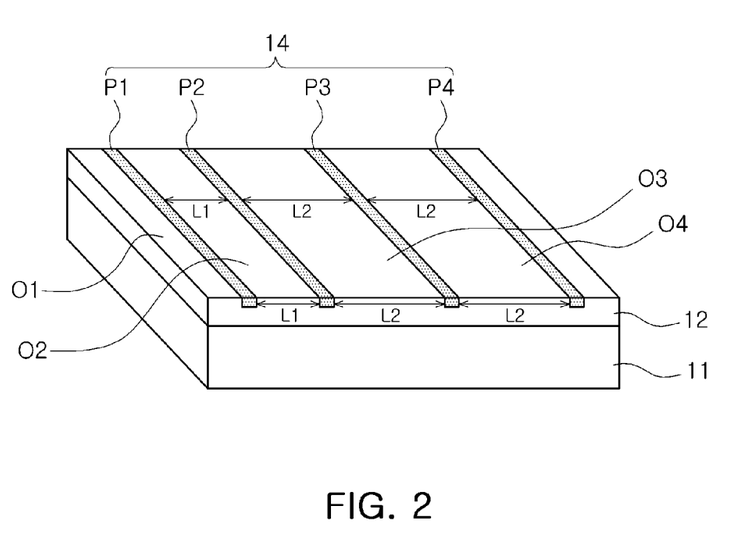
FIG. 2 is a cutaway perspective view showing a pattern of a current blocking layer of the semiconductor light emitting device shown in FIG. 1.

The respective patterns P1 to P4 used according to the present embodiment may have a bar shape as shown in FIG. 2. The patterns P1 to P4 may have a shape related to that of the electrode branches 17b1 to 17b5, but are not limited thereto.

Further, the plurality of patterns P1 to P4 may be arrayed to correspond to an array direction of the electrode branches 17b1 to 17b5.

Through the shape and array of the patterns P1 to P4, relatively effective current spreading may be promoted in consideration of current distribution by the electrode branches 17b1 to 17b5.

In order to increase current spreading effects, the patterns P1 to P4 employed in the present embodiment may be arrayed such that an interval between patterns adjacent to a region overlapped with the bonding pad 17a is smaller than an interval between patterns of another region. That is, as shown in FIG. 2, an interval L1 between two patterns P1 and P2 nearest to the bonding pad 17a may be adjusted to be smaller than an interval between other adjacent patterns P2 and P3 or P3 and P4.

This pattern interval scheme may facilitate effective dispersion of current largely concentrated in a region adjacent to the bonding pad 17a, and as a result, current spreading effects may be relatively more uniform throughout an overall area.

Meanwhile, unlike the present embodiment, the plurality of patterns may be arrayed such that the size thereof becomes larger from the region overlapped with the bonding pad toward a region distanced therefrom, from which relatively uniform current spreading effects may be expected by considering the fact that a current concentration extent is gradually reduced along with the bonding pad.

In addition, the first electrode structure may be diversely varied, and thus, may be varied and implemented according to various embodiments. For example, a bonding pad may be applied thereto by employing a plurality of bonding pads, and therefore, the pattern of a current blocking layer may also be varied. Further, the array of electrode branches provided in consideration of the current spreading effects may also be implemented in various forms, so pattern positions may also be changed to improve the current spreading effects.

Figure 3:
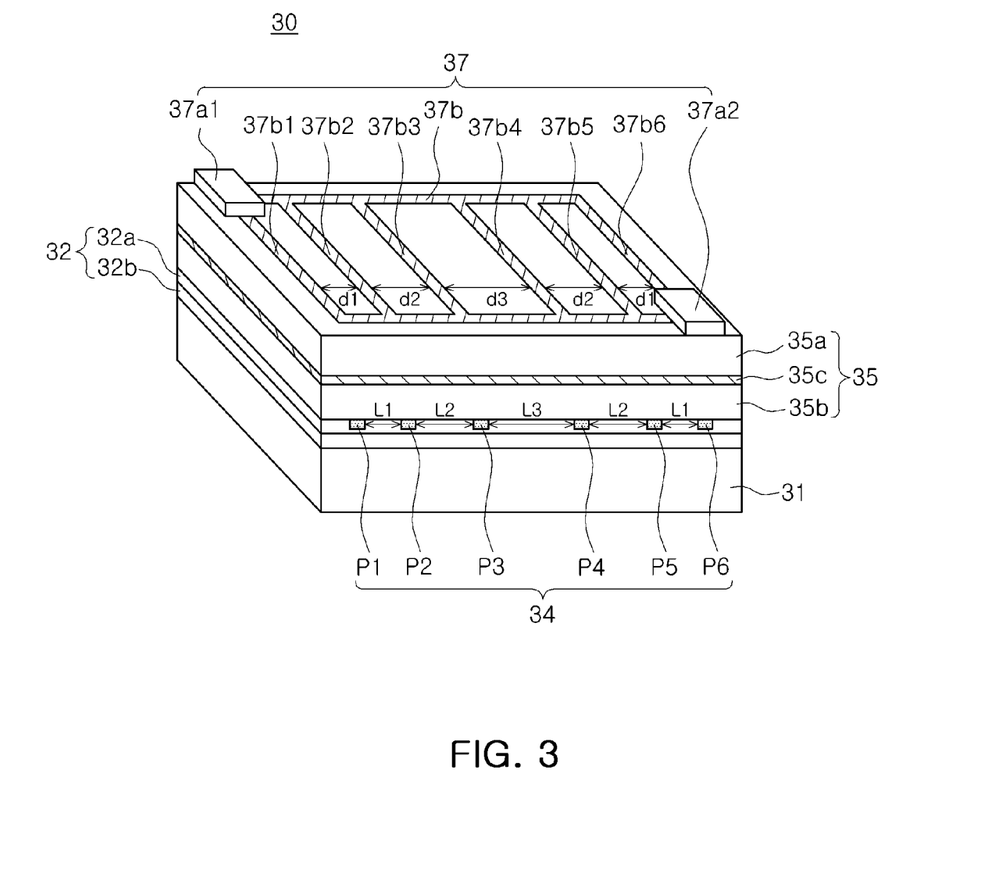
FIG. 3 is a schematic perspective view of a semiconductor light emitting device according to another embodiment of the present invention.

Among various embodiments of the present invention, one embodiment is illustrated in FIG. 3. FIG. 3 provides a new array of electrode branches together with two bonding pads according to another embodiment of the present invention.

A semiconductor light emitting device 30 shown in FIG. 3 may include a semiconductor light emitting laminate 35 including a first conductive semiconductor layer 35a, a second conductive semiconductor layer 35b, and an active layer 35c interposed therebetween, and may further include first and second electrodes 37 and 32 respectively formed on the first and second conductive semiconductor layers 35a and 35b.

In the present embodiment, the second electrode 32 may include an ohmic contact layer 32a forming ohmic contact with the second conductive semiconductor layer 35b, and a barrier layer 32b. The ohmic contact layer 32a may be formed of a high reflective ohmic contact material. The ohmic contact layer 32a may be at least one layer formed of a material selected from the group consisting of Ag, Ni, Al, Rh, Pd, Ir, Ru, Mg, Zn, Pt, Au and a composition thereof. The barrier layer 32b may prevent constituent elements of a conductive substrate 31 from diffusing to the ohmic contact layer and thus deteriorating ohmic characteristics. The barrier layer 32b may be formed of a material selected from Ti, Ni, Cr, Au, TiW, TiN and a composition thereof. That is, the second electrode 32 may be usefully applied according to another embodiment of the present invention.

The first electrode 37 according to the present embodiment may include two bonding pads 37a1 and 37a2 formed on the first conductive semiconductor layer 35a, unlike the embodiment of the present invention described above. The two bonding pads 37a1 and 37a2 may be disposed on two opposing corners so as to promote uniform current spreading throughout the overall area thereof.

The first electrode 37 may include an extension electrode 37b connected thereto as shown in FIG. 3. The extension electrode 37b may include a plurality of electrode branches 37b1 to 37b6 arrayed in parallel. However, the plurality of electrode branches 37b1 to 37b6 may be arrayed such that intervals therebetween are larger in a direction away from the respective bonding pads 37a1 and 37a2 (d1<d2<d3). That is, an interval d3 between central electrode branches 37b3 and 37b4 may have a widest interval therebetween as shown in FIG. 3.

The semiconductor light emitting device 30 may include a current blocking layer 34 formed between the second conductive semiconductor layer 35b and the ohmic contact layer 32a. The current blocking layer 34 may have a plurality of patterns P1 to P6 formed to be spaced apart from one another.

The respective patterns P1 to P6 according to the present embodiment may have a bar shape as shown in FIG. 2, and may be arrayed to correspond to an array direction of the electrode branches 37b1 to 37b6.

According to the present embodiment, in order to improve current spreading effects, the patterns P1 to P6 employed according to the present embodiment may be also arrayed such that an interval between patterns adjacent to a region overlapped with the bonding pad 37a1 or 37a2 is smaller than an interval between patterns of another region.

In detail, as shown in FIG. 3, an interval L1 between patterns P1 and P2 nearest to each bonding pad 37a1 may be equal to an interval L1 between patterns P5 and P6 nearest to each bonding pad 37a2, and the intervals D1 may be set to be smaller than intervals L2 and L3 between other adjacent patterns P2 and P3, P3 and P4, and P4 and P5.

In addition, in the present embodiment, the plurality of patterns P1 to P6 may be formed such that they are respectively positioned on regions overlapped with the plurality of electrode branches 37b1 to 37b6. The pattern array of the current blocking layer 34 may obtain relatively effective current spreading effects by individually suppressing current concentration phenomena due to the respective electrode branches 37b1 to 37b6.

The embodiment described above describes the case in which the current blocking layer is disposed on a side of a layer opposite to a light emission surface (that is, the side of the layer on which the conductive substrate is located), in other words, between the ohmic contact layer and the second conductive semiconductor layer, but is not limited thereto. That is, according to another embodiment of the present invention, the current blocking layer may be implemented in the manner in which it is provided in a region provided as the light emission surface instead of a conductive substrate, that is, in a first conductive semiconductor layer. This embodiment is illustrated with reference to FIGS. 4 to 7.

First, a basic example in which the current blocking layer is provided on the light emission surface will be described with reference to FIGS. 4 and 5.

A semiconductor light emitting device 40 according to the present embodiment may include a semiconductor light emitting laminate 45 including a first conductive semiconductor layer 45a, a second conductive semiconductor layer 45b, and an active layer 45c interposed therebetween. In addition, the semiconductor light emitting device 40 may include first and second electrodes 47 and 42 respectively formed on the first and second conductive semiconductor layers 45a and 45b.

In the present embodiment, the second electrode 42 may include an ohmic contact layer 42a forming ohmic contact with the second conductive semiconductor layer 45b, and a barrier layer 42b. The ohmic contact layer 42a may be formed of a high reflective ohmic contact material. The ohmic contact layer 42a may be at least one layer formed of a material selected from the group consisting of, Ag, Ni, Al, Rh, Pd, Ir, Ru, Mg, Zn, Pt, Au and a composition thereof. The barrier layer 42b may be formed of a material selected from Ti, Ni, Cr, Au, TiW, TiN and a composition thereof.

Further, the first electrode 47 may include a transparent electrode layer 47b formed on an upper surface of the first conductive semiconductor layer 45a, together with a bonding pad 47a formed on one corner of the first conductive semiconductor layer 45a.

In detail, the present embodiment describes the case in which the transparent electrode layer 47b is substantially formed on an overall region of an upper surface of the first conductive semiconductor layer 45a, and the bonding pad 47a is provided on the transparent electrode layer 47b, but may also be directly formed on the first conductive semiconductor layer 45a. However, more specifically, as shown in FIG. 4, a pad current blocking layer 46 may be introduced in order to prevent current from being concentrated in an immediately lower region of the bonding pad 47a.

The semiconductor light emitting device 40 according to the present invention may include a current blocking layer 44 formed between the first conductive semiconductor layer 45a and the transparent electrode layer 47b as described above. The current blocking layer 44 may be formed by selectively using an electrically insulating material such as $SiO_2$ or $SiN_x$, but may be implemented in the manner different from the description above, for example, in a scheme of forming a high resistive region in which a schottky junction employing damaged crystals therein is implemented.

The current blocking layer 44 may include a plurality of patterns P1 to P4 formed to be spaced apart from one another, and the plurality of patterns P1 to P4 may be formed to have a bent shape, having a predetermined distance from the bonding pad 47a.

In the present embodiment, the plurality of patterns P1 to P4 may also be arrayed such that an interval between patterns adjacent to the bonding pad 47a is smaller than an interval between patterns of another region.

Figure 4:
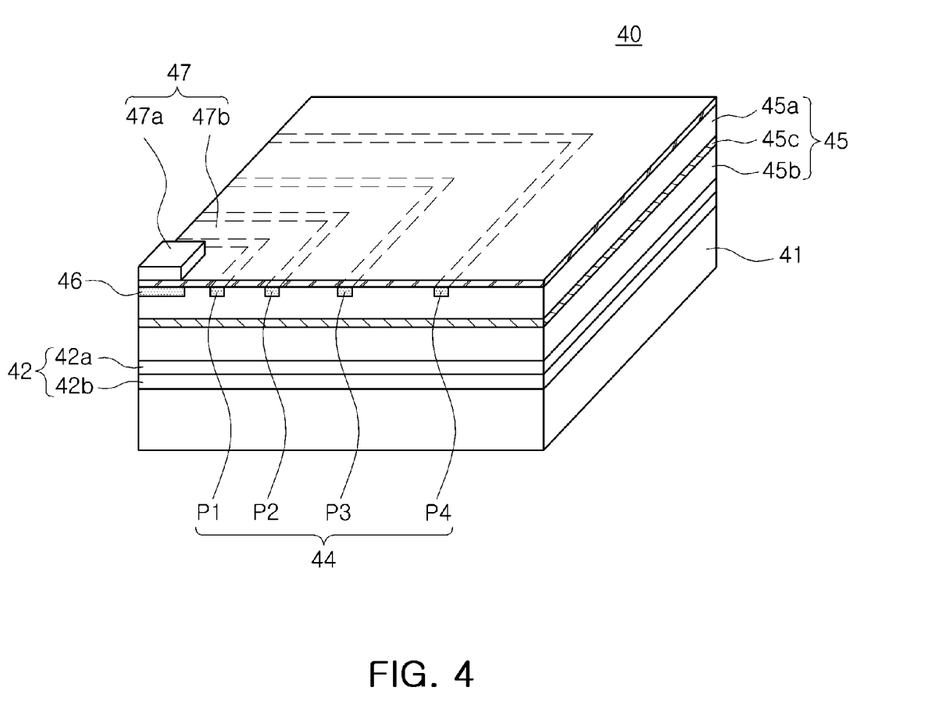
FIG. 4 is a schematic perspective view of a semiconductor light emitting device according to another embodiment of the present invention.
Figure 5:
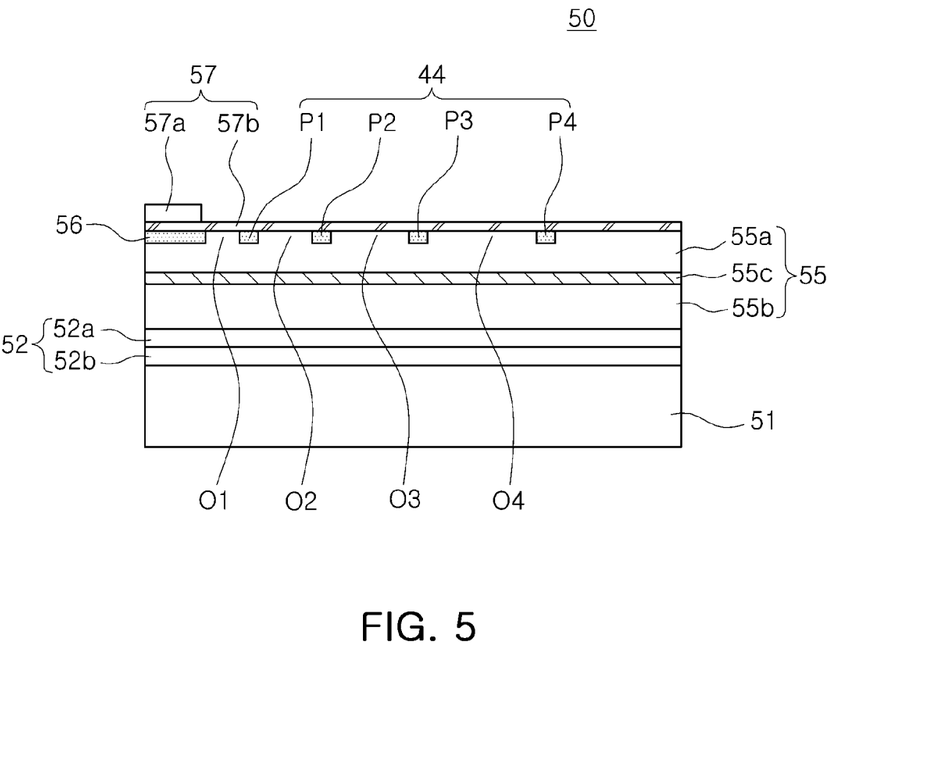
FIG. 5 is a cross-sectional view of the semiconductor light emitting device shown in FIG. 4.

In detail, as shown in FIGS. 4 and 5, the plurality of patterns P1 to P4 may be arrayed such that intervals therebetween are larger in a direction away from the bonding pad 47a. Through the pattern interval scheme described as above, open regions defined as contact regions between the transparent electrode layer 46 and the first conductive semiconductor layer 47 may be formed to have increasingly large areas away from the bonding pad 47a. (Comparison with regard to areas: O1<O2<O3<O4).

Through the pattern array described above, an effect in which relatively large current, concentrated on a region adjacent to the bonding pad 47a, may be dispersed to a region relatively distant from the bonding pad 47a may be expected. As a result, uniform current spreading effects may be obtained across the entire region.

Figure 6:
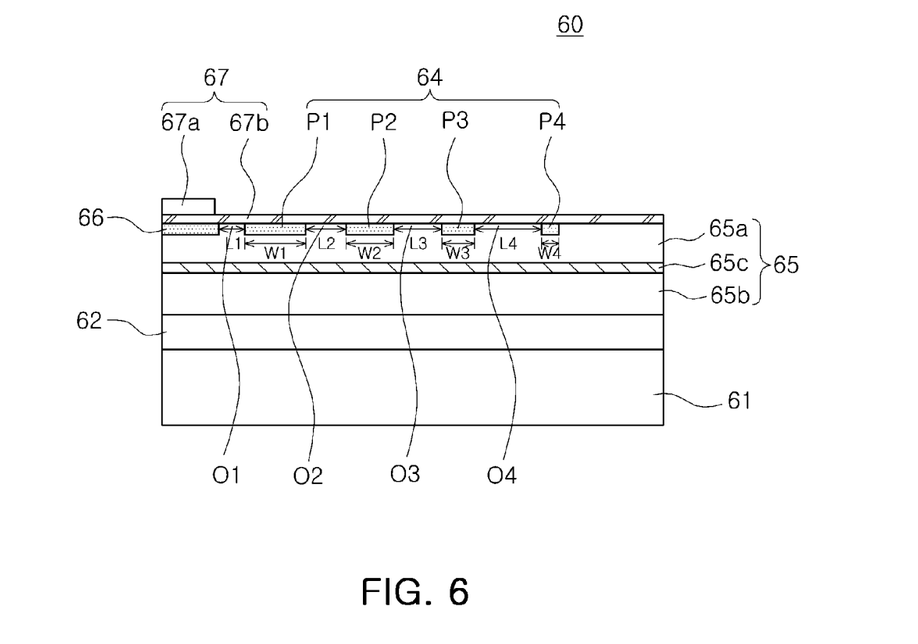
FIG. 6 is a cross-sectional view of a semiconductor light emitting device according to another embodiment of the present invention.

FIG. 6 is a cross-sectional view of a semiconductor light emitting device according to another embodiment of the present invention, in which a current blocking layer is disposed on a light emission region.

A semiconductor light emitting device 60 shown in FIG. 6 may include a semiconductor light emitting laminate 65 including a first conductive semiconductor layer 65a, a second conductive semiconductor layer 65b, and an active layer 65c interposed therebetween. In addition, the semiconductor light emitting device 60 may include first and second electrodes 67 and 62 respectively formed on the first and second conductive semiconductor layers 65a and 65b.

In the present embodiment, the second electrode 62 may include an ohmic contact layer. In addition, the first electrode 67 may include a transparent electrode layer 67b formed on an upper surface of the first conductive semiconductor layer 65a, together with a bonding pad 67a formed on one corner of the first conductive semiconductor layer 65a. In addition, in order to prevent current from being concentrated in an immediately low region of the bonding pad 67a, a pad current blocking layer 66 may be formed. The pad current blocking layer 66 may be formed through a process equal to the pattern formation process of another current blocking layer 64.

The semiconductor light emitting device 60 according to the present embodiment may include the current blocking layer 64 formed between the first conductive semiconductor layer 65a and the transparent electrode layer 67b. The patterns P1 to P4 configuring the current blocking layer 64 may be arrayed such that intervals therebetween are larger in a direction away from the bonding pad 67a in a similar manner to the embodiment described above (L1<L2<L3<L4).

Through the pattern interval scheme, open regions O1 to O4 defined as contact regions between the transparent electrode layer 67b and the first conductive semiconductor layer 65a may be formed to have an area increased in a direction away from the bonding pad 67a.

In addition, in the present embodiment, pattern widths W1 to W4 of the current blocking layer 64 may become larger toward a region adjacent to the bonding pad 67a such that a current concentration phenomenon may be reduced. That is, as shown in FIG. 6, the widths of respective patterns may be designed to become smaller away from the bonding pad 67a (W1>W2>W3>W4), whereby current spreading effects may be improved.

As described above, the current blocking layer used in the embodiments of the present invention may be largely proposed as two forms. That is, the embodiment of the present invention describes the case in which the current blocking layer is disposed on a region opposite to a light emission surface, that is, a conductive substrate, and the case in which the current blocking layer is formed on the light emission surface, that is, the first conductive semiconductor layer, according to a region in which the current blocking layer is located; but these cases may be implemented by being combined with each other as shown in FIG. 7.

Figure 7:
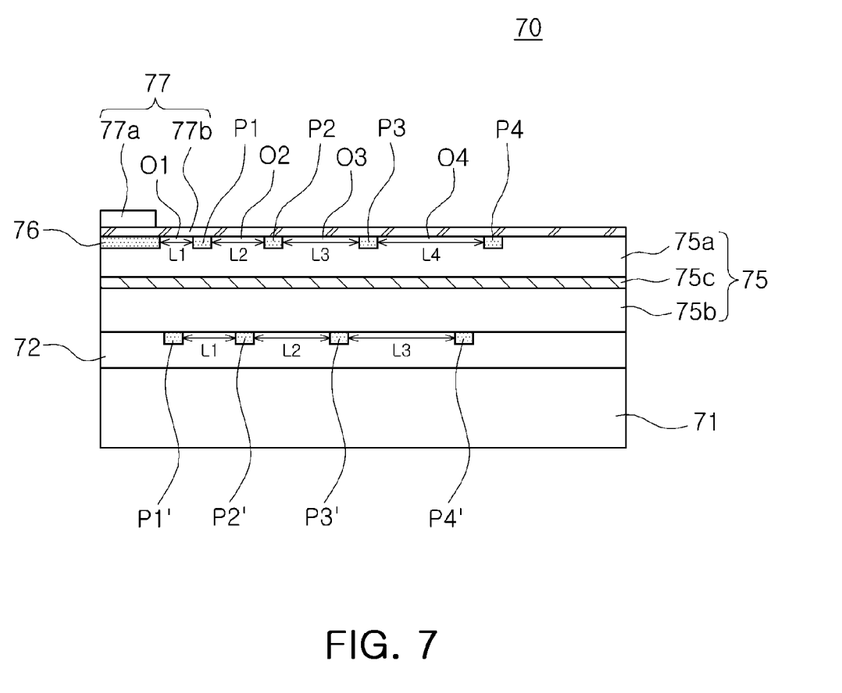
FIG. 7 is a cross-sectional view of a semiconductor light emitting device according to another embodiment of the present invention.

A semiconductor light emitting device 70 shown in FIG. 7 may include a semiconductor light emitting laminate 75 including a first conductive semiconductor layer 75a, a second conductive semiconductor layer 75b, and an active layer 75c interposed therebetween. In addition, the semiconductor light emitting device 70 may include first and second electrodes 77 and 72 respectively formed on the first and second conductive semiconductor layers 75a and 75b.

In the present embodiment, the second electrode 72 may include an ohmic contact layer. In addition, the first electrode 77 may include a transparent electrode layer 77b formed on an upper surface of the first conductive semiconductor layer 75a, together with a bonding pad 77a formed on one corner of the first conductive semiconductor layer 75a.

The current blocking layer employed in the present embodiment may include a plurality of second patterns P1' to P4' disposed between the second electrode 72 and the second conductive semiconductor layer 75c, as well as a plurality of first patterns P1 to P4 disposed between the transparent electrode layer 77b and the first conductive semiconductor layer 75a in a similar manner to the embodiment illustrated in FIG. 5.

The plurality of first patterns P1 to P4 may be arrayed such that intervals therebetween are larger in a direction away from the bonding pad 77a (L1<L2<L3<L4). Through this pattern interval scheme, open regions contacted through this pattern interval may have an area increased away from the bonding pad 77a (comparison with regard to an area: O1<O2<O3<O4). In a similar manner thereto, the plurality of second patterns P1' to P4' may also be arrayed such that intervals therebetween are larger in a direction away from a region overlapped with the bonding pad 77a (L1'<L2'<L3'). Through this pattern array scheme, current spreading effects may be improved on the entire region.

In addition, as shown in FIG. 7, the plurality of first patterns P1 to P4 may be disposed in a position not overlapped with the plurality of second patterns P1' to P4' in a vertical direction, that is, a thickness direction having a relatively short distance therein, whereby current may flow to disperse in a transverse direction, resulting in increased current spreading effects.

As set forth above, according to an embodiment of the present invention, current spreading effects may be significantly increased by forming current blocking layer patterns having different intervals therebetween according to a current density anticipated in each position, so light emitting efficiency therethrough may be largely improved. For example, current blocking layer patterns may be formed to have an area increased from a region under a bonding pad having a limited area to a region distanced therefrom, whereby current spreading effects may be improved.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device, comprising:
   a semiconductor light emitting laminate including a first conductive semiconductor layer, a second conductive semiconductor layer, and an active layer interposed therebetween;
   a first electrode having at least one bonding pad disposed on a portion of an upper surface of the first conductive semiconductor layer;
   a second electrode having an ohmic contact layer disposed on the second conductive semiconductor layer; and
   a current blocking layer disposed between the second conductive semiconductor layer and the ohmic contact layer and having a plurality of patterns formed thereon, the plurality of patterns being arrayed such that intervals between the plurality of patterns become smaller toward a region overlapped with the bonding pad,
   wherein the current blocking layer includes an electrically insulating material or damaged crystals disposed on the second conductive semiconductor layer.

2. The semiconductor light emitting device of claim 1, wherein the first electrode is disposed on the first conductive semiconductor layer and further includes a plurality of electrode branches extending from the bonding pad.

3. The semiconductor light emitting device of claim 2, wherein the plurality of electrode branches are arrayed in parallel in a direction in which the plurality of patterns are arrayed.

4. The semiconductor light emitting device of claim 3, wherein the intervals between the plurality of patterns become larger in a direction away from the region overlapped with the bonding pad.

5. The semiconductor light emitting device of claim 3, wherein the plurality of electrode branches are arrayed to have an identical predetermined interval therebetween.

6. The semiconductor light emitting device of claim 3, wherein the plurality of patterns are formed to be disposed on a region overlapped with the plurality of electrode branches.

7. The semiconductor light emitting device of claim 1, wherein the at least one bonding pad is a plurality of bonding pads formed on different regions of the upper surface of the first conductive semiconductor layer.

8. The semiconductor light emitting device of claim 7, wherein:
   the plurality of bonding pads are respectively disposed on opposing corners, and
   the intervals between the plurality of patterns become larger toward a region overlapped with the center of the first conductive semiconductor layer.

9. The semiconductor light emitting device of claim 1, wherein widths of the plurality of patterns become larger toward the region overlapped with the bonding pad.

10. The semiconductor light emitting device of claim 9, wherein the widths of the plurality of patterns become smaller away from the region overlapped with the bonding pad.

11. The semiconductor light emitting device of claim 1, wherein:
   the current blocking layer includes a region in which the second conductive semiconductor layer has damaged crystals, and
   the damaged crystals of the second conductive semiconductor layer have a schottky junction with the ohmic contact layer.

12. The semiconductor light emitting device of claim 1, further comprising a conductive substrate provided with the second electrode in order to support the semiconductor light emitting laminate.

13. The semiconductor light emitting device of claim 12, wherein the second electrode further includes a barrier layer disposed between the ohmic contact layer and the conductive substrate.

14. The semiconductor light emitting device of claim 1, wherein the first electrode further includes a transparent electrode layer disposed on the first conductive semiconductor layer, and the bonding pad is disposed on the transparent electrode layer.

15. The semiconductor light emitting device of claim 14, further comprising an additive current blocking layer having a plurality of additional patterns formed between the first conductive semiconductor layer and the transparent electrode layer.

16. The semiconductor light emitting device of claim 15, wherein the plurality of additional patterns are arrayed such that intervals between the plurality of additional patterns become smaller toward the region overlapped with the bonding pad.

17. The semiconductor light emitting device of claim 16, wherein the plurality of additional patterns are disposed on a position not overlapped with the plurality of patterns.

18. A semiconductor light emitting device, comprising:
   a semiconductor light emitting laminate including a first conductive semiconductor layer, a second conductive semiconductor layer, and an active layer interposed therebetween;
   a first electrode having a transparent electrode layer disposed on an upper surface of the first conductive semiconductor layer, and at least one bonding pad disposed on a portion of the transparent electrode layer;

a second electrode having an ohmic contact layer disposed on the second conductive semiconductor layer; and a current blocking layer disposed between the first conductive semiconductor layer and the transparent electrode layer and having a plurality of patterns disposed thereon, the plurality of patterns being arrayed such that intervals between the plurality of patterns become smaller toward a region overlapped with the bonding pad, wherein the current blocking layer includes an electrically insulating material or damaged crystals disposed on the second conductive semiconductor layer.

19. The semiconductor light emitting device of claim 18, wherein intervals between the plurality of patterns become larger in a direction away from the region overlapped with the bonding pad.

20. The semiconductor light emitting device of claim 19, wherein the at least one bonding pad is a plurality of bonding pads disposed on different regions of the upper surface of the transparent electrode layer.

21. The semiconductor light emitting device of claim 20, wherein:

the plurality of bonding pads are respectively disposed on opposing corners, and the intervals between the plurality of patterns become larger toward the center of the first conductive semiconductor layer.

22. The semiconductor light emitting device of claim 18, wherein widths of the plurality of patterns become larger toward the region overlapped with the bonding.

23. The semiconductor light emitting device of claim 22, wherein the widths of the plurality of patterns become smaller away from the region overlapped with the bonding pad.

24. The semiconductor light emitting device of claim 18, further comprising a conductive substrate provided with the second electrode in order to support the semiconductor light emitting laminate.

25. The semiconductor light emitting device of claim 24, wherein the second electrode further includes a barrier layer disposed between the ohmic contact layer and the conductive substrate.

* * * * *